United States Patent
Jones et al.

(10) Patent No.: US 8,647,554 B2
(45) Date of Patent: Feb. 11, 2014

(54) RESIDUAL LAYER THICKNESS MEASUREMENT AND CORRECTION

(75) Inventors: Christopher Ellis Jones, Austin, TX (US); Niyaz Khusnatdinov, Round Rock, TX (US); Stephen C. Johnson, Austin, TX (US); Philip D. Schumaker, Austin, TX (US); Pankaj B. Lad, DeSoto, TX (US)

(73) Assignee: Molecular Imprints, Inc., Austin, TX (US)

(*) Notice: Subject to any disclaimer, the term of this patent is extended or adjusted under 35 U.S.C. 154(b) by 742 days.

(21) Appl. No.: 12/835,009

(22) Filed: Jul. 13, 2010

(65) Prior Publication Data

US 2010/0286811 A1 Nov. 11, 2010

Related U.S. Application Data

(63) Continuation of application No. 11/694,017, filed on Mar. 30, 2007, now abandoned, which is a continuation-in-part of application No. 11/143,092, filed on Jun. 2, 2005.

(60) Provisional application No. 60/788,808, filed on Apr. 3, 2006, provisional application No. 60/576,878, filed on Jun. 3, 2004.

(51) Int. Cl.
   *B27N 3/18* (2006.01)
(52) U.S. Cl.
   USPC ............................................. 264/319; 700/110
(58) Field of Classification Search
   USPC ............................................. 264/319; 700/110
   See application file for complete search history.

(56) References Cited

U.S. PATENT DOCUMENTS

| | | |
|---|---|---|
| 1,236,304 A | 9/1917 | Howell |
| 3,503,538 A | 3/1970 | Barnes |
| 3,781,214 A | 12/1973 | Nemoto at al. |
| 4,512,848 A | 4/1985 | Deckman et al. |
| 4,731,155 A | 3/1988 | Napoli et al. |
| 4,848,911 A | 7/1989 | Uchida et al. |
| 4,936,465 A | 6/1990 | Zold |
| 4,959,252 A | 9/1990 | Bonnebat et al. |
| 5,028,366 A | 7/1991 | Harakal et al. |
| 5,110,514 A | 5/1992 | Soane |
| 5,148,037 A | 9/1992 | Suda et al. |
| 5,151,754 A | 9/1992 | Ishibashi et al. |
| 5,240,550 A | 8/1993 | Boehnke et al. |
| 5,259,926 A | 11/1993 | Kuwabara et al. |

(Continued)

FOREIGN PATENT DOCUMENTS

| | | |
|---|---|---|
| EP | 1254704 A2 | 11/2002 |
| JP | 1-196749 | 8/1989 |

(Continued)

OTHER PUBLICATIONS

Feynman, There's Plenty of Room at the Bottom, Dec. 1, 1959.

(Continued)

*Primary Examiner* — Yogendra Gupta
*Assistant Examiner* — John Robitaille
(74) *Attorney, Agent, or Firm* — Cameron A. King

(57) ABSTRACT

In nano-imprint lithography it is important to detect thickness non-uniformity of a residual layer formed on a substrate. Such non-uniformity is compensated such that a uniform residual layer may be formed. Compensation is performed by calculating a corrected fluid drop pattern.

20 Claims, 5 Drawing Sheets

(56) References Cited

U.S. PATENT DOCUMENTS

| | | |
|---|---|---|
| 5,362,940 A | 11/1994 | MacDonald et al. |
| 5,371,822 A | 12/1994 | Horwitz et al. |
| 5,425,848 A | 6/1995 | Haisma et al. |
| 5,445,195 A | 8/1995 | Kim |
| 5,449,117 A | 9/1995 | Muderlak et al. |
| 5,480,047 A | 1/1996 | Tanigawa et al. |
| 5,512,131 A | 4/1996 | Kumar et al. |
| 5,542,605 A | 8/1996 | Campau |
| 5,545,367 A | 8/1996 | Bae et al. |
| 5,601,641 A | 2/1997 | Stephens |
| 5,669,303 A | 9/1997 | Maracas et al. |
| 5,723,176 A | 3/1998 | Keyworth et al. |
| 5,747,102 A | 5/1998 | Smith et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,849,209 A | 12/1998 | Kindt-Larsen et al. |
| 5,849,222 A | 12/1998 | Jen et al. |
| 5,858,580 A | 1/1999 | Wang et al. |
| 5,886,650 A | 3/1999 | Komatsu et al. |
| 5,948,470 A | 9/1999 | Harrison et al. |
| 5,956,216 A | 9/1999 | Chou |
| 5,974,150 A | 10/1999 | Kaish et al. |
| 6,027,595 A | 2/2000 | Suleski |
| 6,046,056 A | 4/2000 | Parce et al. |
| 6,048,623 A | 4/2000 | Everhart et al. |
| 6,074,827 A | 6/2000 | Nelson et al. |
| 6,089,853 A | 7/2000 | Biebuyck et al. |
| 6,218,316 B1 | 4/2001 | Marsh |
| 6,274,294 B1 | 8/2001 | Hines |
| 6,279,474 B1 | 8/2001 | Liebl |
| 6,306,467 B1 | 10/2001 | White et al. |
| 6,309,580 B1 | 10/2001 | Chou |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,387,330 B1 | 5/2002 | Bova et al. |
| 6,391,217 B2 | 5/2002 | Schaffer et al. |
| 6,482,742 B1 | 11/2002 | Chou |
| 6,498,640 B1 | 12/2002 | Ziger |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,621,960 B2 | 9/2003 | Wang et al. |
| 6,623,579 B1 | 9/2003 | Smith et al. |
| 6,646,662 B1 | 11/2003 | Nebashi et al. |
| 6,678,038 B2 | 1/2004 | Binnard |
| 6,696,220 B2 | 2/2004 | Bailey et al. |
| 6,713,238 B1 | 3/2004 | Chou et al. |
| 6,776,094 B1 | 8/2004 | Whitesides et al. |
| 6,809,356 B2 | 10/2004 | Chou |
| 6,828,244 B2 | 12/2004 | Chou |
| 6,849,558 B2 | 2/2005 | Schaper |
| 6,855,293 B1 | 2/2005 | Zengerle et al. |
| 6,870,584 B2 | 3/2005 | Kawase et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,936,194 B2 | 8/2005 | Watts |
| 6,946,360 B2 | 9/2005 | Chou |
| 6,955,767 B2 | 10/2005 | Chen |
| 6,964,793 B2 | 11/2005 | Willson et al. |
| 7,077,992 B2 | 7/2006 | Sreenivasan et al. |
| 7,117,583 B2 | 10/2006 | Dinan et al. |
| 7,122,482 B2 | 10/2006 | Xu et al. |
| 7,128,875 B2 | 10/2006 | Cubicciotti |
| 7,157,036 B2 | 1/2007 | Choi et al. |
| 2002/0005880 A1 | 1/2002 | Ashe et al. |
| 2002/0042027 A1 | 4/2002 | Chou et al. |
| 2002/0094496 A1 | 7/2002 | Choi et al. |
| 2002/0122873 A1 | 9/2002 | Mirkin et al. |
| 2002/0132482 A1 | 9/2002 | Chou |
| 2002/0135099 A1 | 9/2002 | Robinson et al. |
| 2002/0167117 A1 | 11/2002 | Chou |
| 2002/0168578 A1 | 11/2002 | Wang et al. |
| 2002/0170880 A1 | 11/2002 | Chen |
| 2003/0001992 A1 | 1/2003 | Kawase et al. |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0137494 A1 | 7/2003 | Tulbert |
| 2003/0174435 A1 | 9/2003 | Dinan et al. |
| 2003/0186140 A1 | 10/2003 | Fries |
| 2004/0029041 A1 | 2/2004 | Shih et al. |
| 2004/0036201 A1 | 2/2004 | Chou et al. |
| 2004/0046288 A1 | 3/2004 | Chou |
| 2004/0058067 A1 | 3/2004 | Law et al. |
| 2004/0065976 A1 | 4/2004 | Sreenivasan et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0231781 A1 | 11/2004 | Bao et al. |
| 2004/0250945 A1 | 12/2004 | Zheng et al. |
| 2004/0261703 A1 | 12/2004 | Korbin et al. |
| 2005/0037143 A1 | 2/2005 | Chou et al. |
| 2005/0106321 A1 | 5/2005 | McMackin et al. |
| 2005/0145119 A1 | 7/2005 | Tan et al. |
| 2005/0156353 A1 | 7/2005 | Watts et al. |
| 2005/0156357 A1 | 7/2005 | Willson et al. |
| 2005/0160011 A1 | 7/2005 | Sreenivasan et al. |
| 2005/0170670 A1 | 8/2005 | King et al. |
| 2005/0176242 A1 | 8/2005 | Kawase |
| 2005/0189676 A1 | 9/2005 | Sreenivasan |
| 2005/0230882 A1 | 10/2005 | Watts et al. |
| 2005/0236739 A1 | 10/2005 | Willson et al. |
| 2005/0253137 A1 | 11/2005 | Whang et al. |
| 2005/0253307 A1 | 11/2005 | Sreenivasan |
| 2005/0276919 A1 | 12/2005 | Truskett et al. |
| 2005/0284886 A1 | 12/2005 | Penciu |
| 2006/0076717 A1 | 4/2006 | Sreenivasan et al. |
| 2006/0077374 A1 | 4/2006 | Sreenivasan et al. |
| 2006/0121728 A1 | 6/2006 | McMackin et al. |
| 2006/0125154 A1 | 6/2006 | Watts et al. |
| 2006/0213441 A1 | 9/2006 | Kobrin et al. |
| 2006/0279024 A1 | 12/2006 | Choi et al. |

FOREIGN PATENT DOCUMENTS

| | | |
|---|---|---|
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

(56) References Cited

OTHER PUBLICATIONS

Xia et al., Soft Lithography, Angew. Chem. Int. Ed., pp. 550-575 Jan. 1, 1998.

Chou et al., Imprint Lithography with Sub-10 nm Feature Size and High Throughput. Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, Col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology, vol b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash imprint Lithography: Template Surface Treatment and Defect Analysis, Journal of Vacuum Science, B 18(6), pp. 3572-3577 Nov. 1, 2000.

Wronosky et al., Wafer and Reticle Positioning System for the Extreme Ultraviolet Lithography Engineering Test Stand, Emerging Lithography Technologies, Proceedings of SPIE vol. 3997, pp. 829-839 Jul. 1, 2000.

Williams et al., Magnetic Levitation Scanning Stage for Extreme Ultraviolet Lithography, American Society for Precision Engineering, vol. 20, pp. 583-586 Nov. 1, 1999.

Schneider et al., Stripes of Partially Fluorinated Alkyl Chains: Dipolar Langmuir Monolayers, J. Chem. Phys. vol. 122, Issue 9 Mar. 1, 2005.

Nerac.com Retro Search, Fluid Dispensing, May 4, 2005.

Brubaker et al., Investigating the Use of Spray-Coating Technology in MEMS Applications, Micro Magazine, pp. 45-55 Mar. 1, 2004.

Xu et al., Development of Imprint Materials for the Step and Flash Imprint Lithography Process, SPIE Microlithography Conference Feb. 1, 2004.

Colburn, Dissertation for the Degree of Doctor of Philosophy, Step and Flash Imprint Lithography: A Low-Pressure, Room-Temperature Nanoimprint Lithography Aug. 1, 2001.

Casey et al., Control of Metal Deposition in a Web Coater, Controlling in both Transverse and Machine Direction, Proceedings, Annual Technical Conference—Society of Vacuum Coaters May 4, 1990.

Lu et al., The Effect of Deposition Parameters on Performance of VME-FPC, Proceedings of the IEEE International Vacuum Microelectronics Conference, IVMC Aug. 16, 2001.

Abstract of Japanese patent 02-192045, Jul. 27, 1990.

RESIDUAL LAYER THICKNESS MEASUREMENT AND CORRECTION

The present application is a continuation of U.S. patent application Ser. No. 11/694,017 filed Mar. 30, 2007, which claims priority to U.S. provisional patent application No. 60/788,808 filed Apr. 3, 2006; and the present application is also a continuation-in-part of U.S. patent application Ser. No. 11/143,092 filed Jun. 2, 2005, which claims priority to U.S. provisional patent application No. 60/576,878 filed Jun. 3, 2004. Each of the aforementioned U.S. patent applications is incorporated by reference herein.

BACKGROUND

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as U.S. patent application publication 2004/0065976 filed as U.S. patent application Ser. No. 10/264,960, entitled, "Method and a Mold to Arrange Features on a Substrate to Replicate Features having Minimal Dimensional Variability"; U.S. patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

Imprint lithography disclosed in each of the aforementioned U.S. patent application publications and U.S. patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

The solidified layer may comprise a residual layer of material, i.e., a contiguous layer. Residual layer thickness (RLT) and residual layer thickness uniformity are key metrics for evaluating the quality of imprinted wafers. For many applications, a plasma etch step directly follows imprinting. Film thickness uniformity requirements for plasma etching are well known in the field. RLT uniformity determines the film thickness uniformity of imprinted samples to be etched. Presently, residual layer thickness uniformity is evaluated using the unaided eye to look at fringe patterns. To that end, there is no quantitative feedback to improve the residual layer uniformity once the liquid is positioned between the template and the substrate.

DETAILED DESCRIPTION

Figure 1:
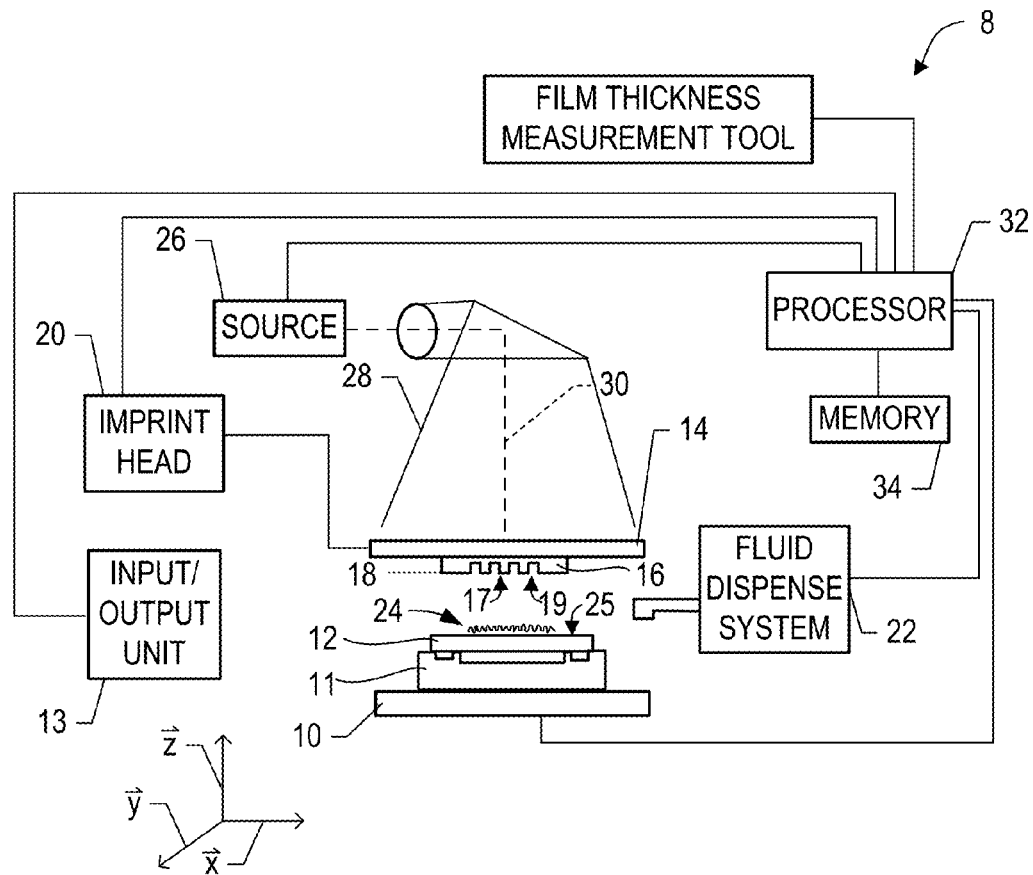
FIG. 1 is a simplified side view of a lithographic system having a template spaced-apart from a substrate.

Referring to FIG. 1, a system 8 to form a relief pattern on a substrate 12 includes a stage 10 upon which substrate 12 is supported and a template 14, having a patterning surface 18 thereon. In a further embodiment, substrate 12 may be coupled to a substrate chuck (not shown), the substrate chuck (not shown) being any chuck including, but not limited to, vacuum and electromagnetic.

Template 14 and/or mold 16 may be formed from such materials including but not limited to, fused-silica, quartz, silicon, organic polymers, siloxane polymers, borosilicate glass, fluorocarbon polymers, metal, and hardened sapphire. As shown, patterning surface 18 comprises features defined by a plurality of spaced-apart recesses 17 and protrusions 19. However, in a further embodiment, patterning surface 18 may be substantially smooth and/or planar. Patterning surface 18 may define an original pattern that forms the basis of a pattern to be formed on substrate 12.

Template 14 may be coupled to an imprint head 20 to facilitate movement of template 14, and therefore, mold 16. In a further embodiment, template 14 may be coupled to a template chuck (not shown), the template chuck (not shown) being any chuck including, but not limited to, vacuum and electromagnetic. A fluid dispense system 22 is coupled to be selectively placed in fluid communication with substrate 12 so as to deposit polymeric material 24 thereon. It should be understood that polymeric material 24 may be deposited using any known technique, e.g., drop dispense, spin-coating, dip coating, chemical vapor deposition (CVD), physical vapor deposition (PVD), and the like.

A source 26 of energy 28 is coupled to direct energy 28 along a path 30. Imprint head 20 and stage 10 are configured to arrange mold 16 and substrate 12, respectively, to be in superimposition and disposed in path 30. Either imprint head 20, stage 10, or both vary a distance between mold 16 and substrate 12 to define a desired volume therebetween that is filled by polymeric material 24.

Figure 2:
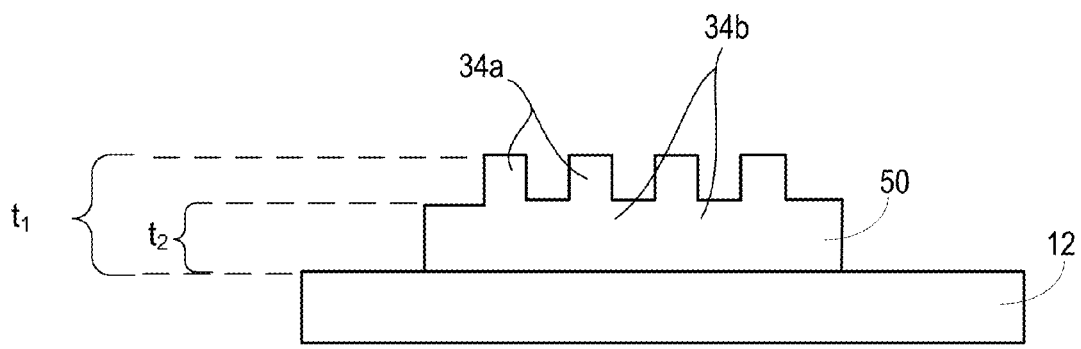
FIG. 2 illustrates a residual layer.

Referring to FIGS. 1 and 2, typically, polymeric material 24 is disposed upon substrate 12 before the desired volume is defined between mold 16 and substrate 12. However, polymeric material 24 may fill the volume after the desired volume has been obtained. After the desired volume is filled with polymeric material 24, source 26 produces energy 28, e.g., broadband energy that causes polymeric material 24 to solidify and/or cross-link conforming to the shape of a surface 25 of substrate 12 and patterning surface 18, defining a patterned layer 50 on substrate 12 having a contiguous formation of polymeric material 24 over surface 25. More specifically, patterned layer 50 comprises sub-portions 34a and 34b, with sub-portions 34b being in superimposition with protrusions 19, with sub-portions 34a having a thickness t1 and sub-portions 34b having a thickness t2, with sub-portions 34b commonly referred to as the residual layer. Thicknesses t1 and t2 may be any thickness desired, dependent upon the application.

Figure 3:
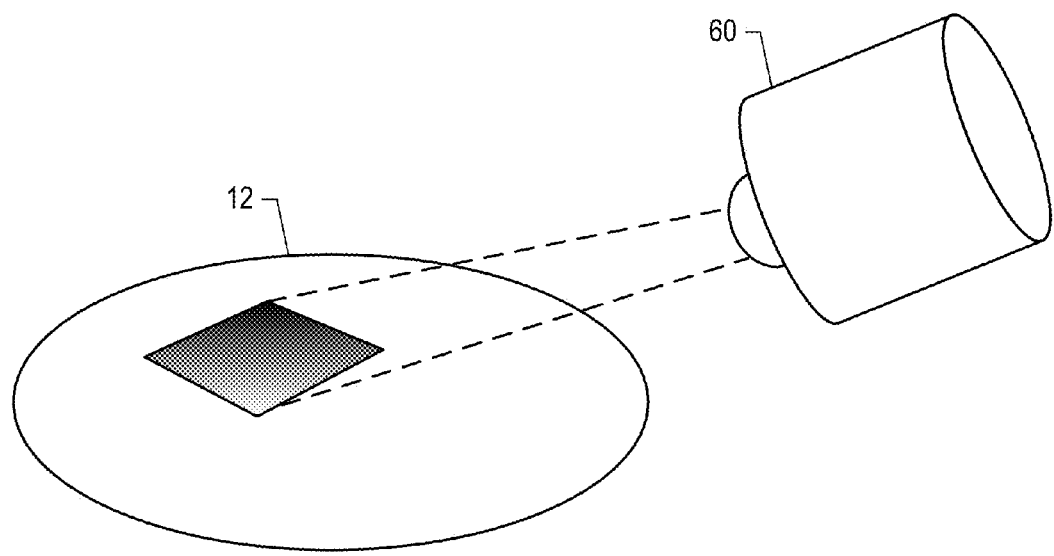
FIG. 3 is a simplified elevation view of a film thickness measurement tool proximate the substrate, shown in FIG. 1.

Referring to FIGS. 1, 2, and 3, the broadband energy may comprise an actinic component including, but not limited to, ultraviolet wavelengths, thermal energy, electromagnetic energy, visible light and the like. The actinic component employed is known to one skilled in the art and typically depends on the material from which imprinting layer 12 is formed. Control of this process is regulated by a processor 32 that is in data communication with stage 10, imprint head 20, fluid dispense system 22, source 26, operating on a computer readable program stored in memory 34. System 8 may further include a film thickness measurement tool 60 coupled with the substrate chuck (not shown), described further below. Film thickness measurement tool 60 may comprise an optical detection system, and further may be in data communication with processor 32. Film thickness measurement tool 60 may be a stand alone tool commonly used in semiconductor fabrication. Such tools are commercially available from Metrosol, Inc., Filmetrics, Rudolph Technologies, and J.A. Woolam.

Patterned layer 50 may have variations among thicknesses t2, which may be undesirable. More specifically, minimizing, if not preventing, variations among sub-portions 34b, and thus, the residual layer may result in improved control of the critical dimension of patterned layer 50, which may be desired. In an example, it may be desirable to reduce variations among sub-portions 34b below the approximately 30 nm level seen in typical imprints in order to minimize, if not prevent, the impact to etched feature critical dimension.

To that end, variations in thicknesses t2 of sub-portions 34b may be measured generating measured data, with the measured data facilitating a design in positioning of polymeric material 24 upon substrate 12. In the present embodiment, polymeric material 24 is positioned as a plurality of droplets upon substrate 12, and thus, the measured data facilitates a design in the drop pattern of polymeric material 24. As a result, uniformity in thicknesses t2 of the sub-portions 34b may be achieved.

The variations in thicknesses t2 of sub-portions 34b may be measured at a plurality of points employing film thickness measurement tool 60, with the optical detection system digitizing imprinted fields, i.e., patterned layer 50, and subsequently employing processor 32 operating on a computer readable program stored in memory 34 to analyze said imprinted fields to construct a map of the thickness t2 of sub-portions 34b across patterned layer 50. To that end, the drop pattern of polymeric material 24 may be varied, i.e., droplets may be added or subtracted, the drop offset may be varied, individual drop volumes of the plurality of drops, based upon the variations in thickness t2 of sub-portions 34b to generate a drop pattern that may facilitate patterned layer 50 comprising sub-portions 34b having a desired thickness uniformity.

Referring to FIGS. 1 and 3, to that end, film thickness measurement tool 60 may be positioned at a fixed angle and distance from substrate 12, with the distance from the imprint field, i.e., patterned layer 50, to film thickness measurement tool 60 being calculated. A calibration process may be required to obtain accurate dimensions of the imprint field. An alternative method for measuring the residual layer thickness measures the optical properties of the film, such as reflected intensity versus wavelength or circular versus elliptical polarization of light reflected from the field. These spectroscopic measurements are then fit to a model of the film stack to determine parameters of interest such as film thickness. Such a process can be implemented using the commercially available film thickness measurement tools noted above.

Figure 4:
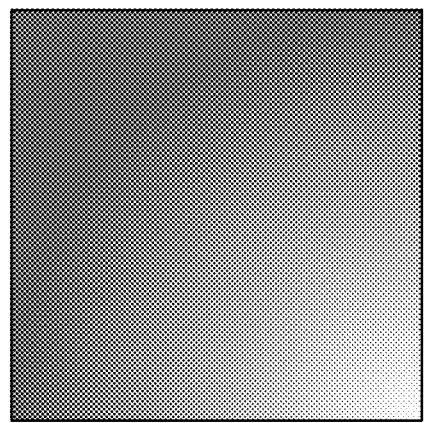
FIG. 4 illustrates an image taken by the thickness measurement tool, shown in FIG. 3.
Figure 5:
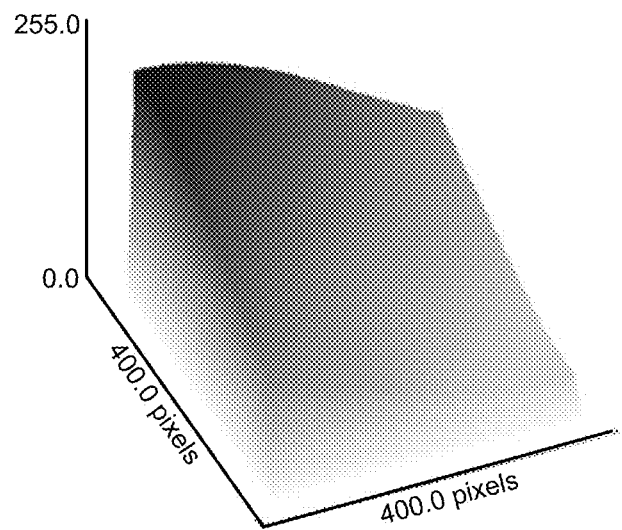
FIG. 5 is simplified three dimensional representation of the image, shown in FIG. 4.

Referring to FIGS. 1 and 4, after an image of the imprint field is taken by film thickness measurement tool 60, processor 32 operating on a computer readable program stored in memory 34 may employ an algorithm to convert the image into a square (or, rectangle, circular, etc.) imprint area. Subsequently, processor 32 may convert differences in color and shade grades into a Z-height profile of the imprint field. FIG. 5 shows an example of a three-dimensional representation of the field shown in FIG. 4. Furthermore, the computer readable program stored in memory 34 may comprise a program entitled ImageJ available from http://rsb.info.nih.gov/ij/.

Further analysis of the imprinted filed is performed to map surface 25 of substrate 12 with a polynomial two-dimensional function, f(x,y). In this way, we can assign a specific thickness to each (x,y) point. Further, an average g(x,y) may be calculated, as well as deviation from this average: $w(x,y)=g(x,y)-f(x,y)$.

The slope g(x,y) will be used to calculate the offsets in X and Y directions of the drop pattern. Deviation function w(x, y) will be used to control local unit fluid volume; number of drops, position of drops and drop volume itself.

Figure 6:
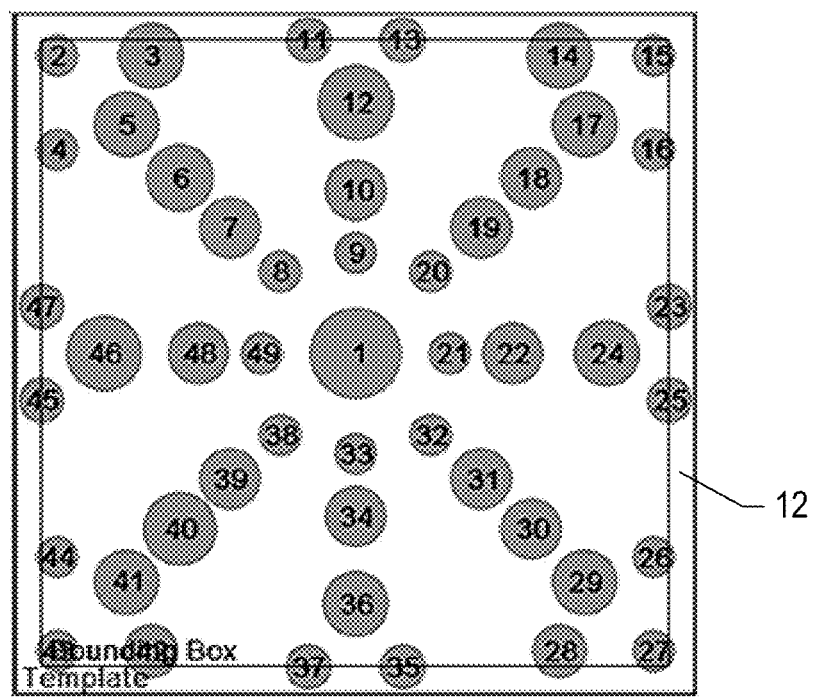
FIG. 6 is a top down view of the substrate having a drop pattern positioned thereon.

FIG. 6 shows an exemplary drop pattern of polymeric material 24 used for imprinting that produced a desired thickness profile shown on FIG. 5. Using a multi-nozzle dispensing unit, various drop patterns can be generated on the substrate, such as a uniform grid superimposed with localized compensating drops.

Furthermore, the drop pattern on FIG. 6 corresponds to the following drop matrix, M(x,y):

1: (0, 0) 3.3113E-4 uL (microliters)×29 drops
(0,0) refers to the center of the template
2: (−0.95, 0.95) 3.3113E-4 uL×6
3: (−0.65, 0.95) 3.3113E-4 uL×15
4: (−0.95, 0.65) 3.3113E-4 uL×6
5: (−0.73, 0.73) 3.3113E-4 uL×15
6: (−0.56, 0.56) 3.3113E-4 uL×16
7: (−0.4, 0.4) 3.3113E-4 uL×13
8: (−0.24, 0.26) 3.3113E-4 uL×6
9: (0, 0.32) 3.3113E-4 uL×6
10: (0, 0.52) 3.3113E-4 uL×13
11: (−0.15, 1) 3.3113E-4 uL×7
12: (0, 0.8) 3.3113E-4 uL×20
13: (0.15, 1) 3.3113E-4 uL×7
14: (0.65, 0.95) 3.3113E-4 uL×15
15: (0.95, 0.95) 3.3113E-4 uL×6
16: (0.95, 0.65) 3.3113E-4 uL×6
17: (0.73, 0.73) 3.3113E-4 uL×15
18: (0.56, 0.56) 3.3113E-4 uL×13
19: (0.4, 0.4) 3.3113E-4 uL×13
20: (0.24, 0.26) 3.3113E-4 uL×6
21: (0.3, 0) 3.3113E-4 uL×6
22: (0.5, 0) 3.3113E-4 uL×13
23: (1, 0.15) 3.3113E-4 uL×7
24: (0.8, 0) 3.3113E-4 uL×15

25: (1, −0.15) 3.3113E-4 uL×7
26: (0.95, −0.65) 3.3113E-4 uL×6
27: (0.95, −0.95) 3.3113E-4 uL×6
28: (0.65, −0.95) 3.3113E-4 uL×10
29: (0.73, −0.73) 3.3113E-4 uL×15
30: (0.56, −0.56) 3.3113E-4 uL×13
31: (0.4, −0.4) 3.3113E-4 uL×13
32: (0.24, −0.26) 3.3113E-4 uL×6
33: (0, −0.32) 3.3113E-4 uL×6
34: (0, −0.52) 3.3113E-4 uL×13
35: (0.15, −1) 3.3113E-4 uL×7
36: (0, −0.8) 3.3113E-4 uL×15
37: (−0.15, −1) 3.3113E-4 uL×7
38: (−0.24, −0.26) 3.3113E-4 uL×6
39: (−0.4, −0.4) 3.3113E-4 uL×13
40: (−0.56, −0.56) 3.3113E-4 uL×19
41: (−0.73, −0.73) 3.3113E-4 uL×15
42: (−0.65, −0.95) 3.3113E-4 uL×10
43: (−0.95, −0.95) 3.3113E-4 uL×6
44: (−0.95, −0.65) 3.3113E-4 uL×6
45: (−1, −0.15) 3.3113E-4 uL×7
46: (−0.8, 0) 3.3113E-4 uL×20
47: (−1, 0.15) 3.3113E-4 uL×7
48: (−0.5, 0) 3.3113E-4 uL×13
49: (−0.3, 0) 3.3113E-4 uL×6

To that end, to compensate for variations among thicknesses t2 of sub-portions 34b, the following may be employed:

1. Use function g(x,y) to calculate drop pattern offset represented as a vector S:

$$S = -A\,\mathrm{grad}(g(x,y))i - B\,\mathrm{grad}(g(x,y))j,$$

where i and j are the unit vectors along X and Y axes. A, B are the proportionality coefficients that need to be determined experimentally, for instance, using a blank mesa template. Imprint new field and measure g(x,y) again. Verify that the slope in X and Y is near zero.

2. After gradient of function g(x,y) is minimized, individual drop volumes are addressed. Multiply the drop pattern matrix M(x,y) by function w'(x,y), where:

$$w'(x,y) = w(x,y)/(\max(w(x,y)) - \min(w(x,y)))$$

So new drop pattern M'(x,y) will be:

$$M'(x,y) = M(x,y) * w'(x,y)$$

3. Verify that the new imprint has uniform thickness by measuring the slope of g(x,y) and minimizing function w(x,y).

Figure 7A:
FIGS. 7A-7D illustrate exemplary steps for addressing a non-uniform residual layer.
Figure 7B:
Figure 7C:
Figure 7D:
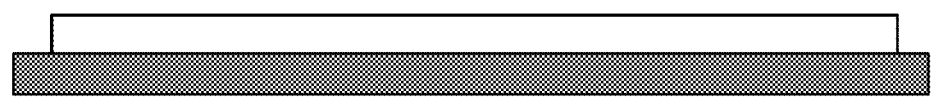
Figure 8:
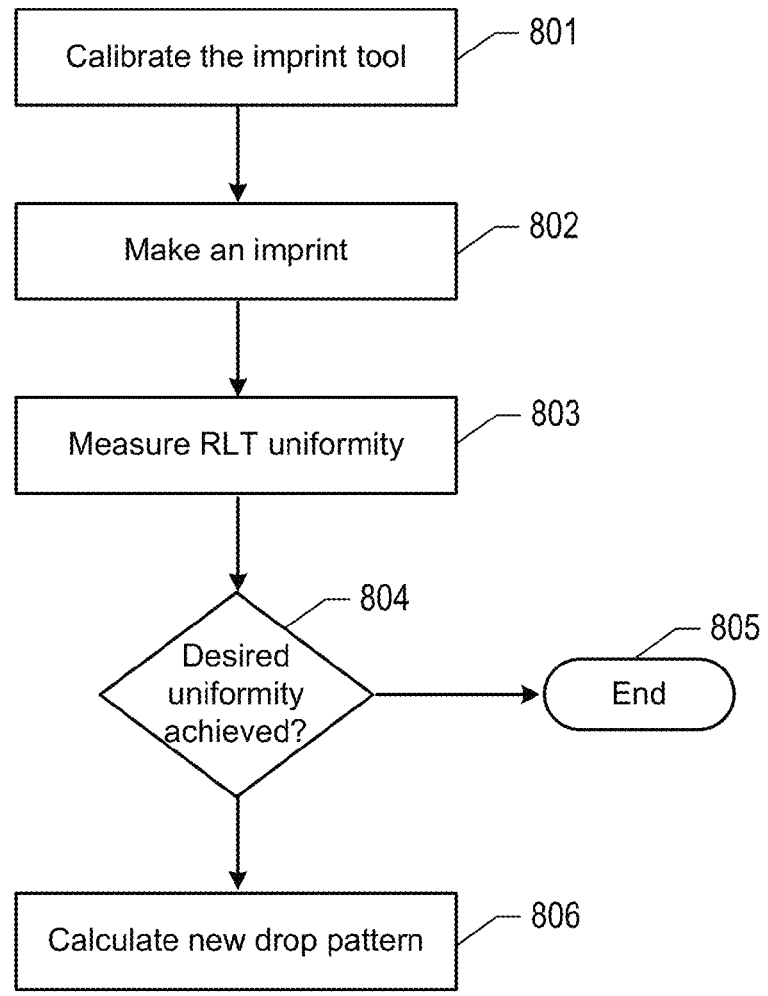
FIG. 8 illustrates a process for compensating for a non-uniform residual layer.

A process for obtaining a uniform residual layer thickness (RLT) is illustrated in FIGS. 7A-7D and 8. In step 801, the imprint tool is calibrated to determine how much fluid to dispense to make an imprint with a desired thickness. In step 802, a uniform distribution of fluid is deposited on the substrate as illustrated in FIG. 7A. An imprint is performed. Evaporation and other non-uniformities may cause the RLT to be non-uniform. In step 803, RLT uniformity is measured across a dense array of points in the imprinted field using the film thickness measurement tool 60. In step 804, if a desired uniformity is achieved, then the process may end in step 805. If not (see FIG. 7B), then the process proceeds to step 806, where one of the above algorithms is employed, such as in software running in processor 32, to calculate a new corrected drop pattern, which will add drops, or increase drop size, to thin areas and/or remove drops, or decrease drop size, from thick areas to achieve improved RLT uniformity. The process then returns to step 802 to make a new imprint using the corrected drop pattern (see FIG. 7C), and steps 803 and 804 are performed again. This process may be repeated as needed until a desired uniformity RLT is achieved, as illustrated in FIG. 7D.

This above-mentioned method may be employed to obtain a desired volume of polymeric fluid 24 positioned upon substrate 12 to the volume of features (protrusions 17 and recesses 19) in mold 16. In a further embodiment, the above-mentioned method may be employed to compensate for evaporation in the plurality of droplets of polymeric material 24 after positioning the same upon substrate 12 and prior to contact with mold 16. In both cases, matching a volume of polymeric material 24 upon substrate 12 to the volume of features in mold 16 result in improved residual layer uniformity, i.e., variations among thicknesses t2 of sub-portions 34b. This improved residual layer uniformity enables better control of feature CDs across imprinted and etched wafers. Furthermore, the above-mentioned may also minimize, if not reduce, and impact of faceting during a breakthrough etch of the residual layer.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

The invention claimed is:

1. In an imprint lithography system, a method comprising:
depositing a plurality of drops of polymerizable imprint fluid on a substrate, the plurality of drops having a drop pattern in which each of the plurality of drops has an assigned size and position on the substrate;
performing a first imprint of the plurality of drops of polymerizable imprint fluid by varying the distance between a mold and the substrate to define a desired volume therebetween filled by the imprint fluid and then solidifying the imprint fluid resulting in a first patterned imprinted layer having a residual layer;
measuring a variation of thicknesses of sub-portions of the residual layer at a plurality of points;
calculating a new drop pattern that compensates for non-uniformities in the thickness of the residual layer by adjusting the assigned size and position of certain ones of the plurality of drops; and
performing a second imprint of a plurality of drops using the new drop pattern resulting in a second imprinted layer having a uniform residual layer thickness.

2. The method of claim 1, further comprising measuring a thickness of a residual layer of the second imprinted layer.

3. The method of claim 2, wherein the second imprinted layer has a residual layer with desired uniformity of the thickness.

4. The method of claim 1, wherein the measuring the variation of thicknesses of subportions at a plurality of points of the residual layer further includes:
employing a film thickness measurement tool; and
employing a processor operated on a computer readable program to analyze and construct a map of the thickness of the sub-portions.

5. The method of claim 4, wherein the film thickness measurement tool provides an image of the first imprinted layer.

6. The method of claim 5, wherein the processor uses an algorithm to convert the image into an imprint area.

7. The method of claim 6, wherein the processor converts differences in color and shade grades of the image into a Z-height profile of the first imprinted layer.

8. The method of claim 4, wherein the map of the thickness of the sub-portions is obtained using a polynomial two-dimensional function with assigned specific thickness to each point.

9. The method of claim 8, wherein average thickness of the points and deviation from the average is determined.

10. The method of claim 9, wherein deviation is used to provide local unit fluid volume, number of drops, position of drops and drop volume.

11. The method of claim 1, wherein adjusting the assigned size and position of certain ones of the plurality of drops includes adding droplets.

12. The method of claim 1, wherein adjusting the assigned size and position of certain ones of the plurality of drops includes subtracting droplets.

13. In an imprint lithography system, a method comprising:

imprinting a first field on a substrate using a first drop pattern of polymerizable fluid, the first drop pattern having a plurality of drops with each drop assigned a size and a position on the substrate, the first field formed by solidifying the polymerizable fluid between a mold and the substrate, the formed first field having a first residual layer;

measuring thickness of the first residual layer across a dense array of points in the imprinted first field using a film thickness measurement tool;

altering the first drop pattern based on the thickness measurements of the first residual layer to provide a second drop pattern, the second drop pattern configured to provide a substantially uniform residual layer; and imprinting a second field using the second drop pattern.

14. The method of claim 13, wherein the second drop pattern compensates for evaporation of the plurality of drops.

15. The method of claim 13, further comprising calibrating the imprint lithography system to determine how much fluid to dispense on the substrate to make the first field with a desired thickness.

16. The method of claim 13, wherein the first drop pattern is a uniform distribution of the fluid on the substrate.

17. The method of claim 13, wherein altering includes adding droplets.

18. The method of claim 13, wherein altering includes subtracting droplets.

19. An imprint lithography method comprising:

depositing a plurality of drops of polymerizable imprint fluid on a substrate, the plurality of drops having a drop pattern in which each of the plurality of drops has an assigned size and position on the substrate;

varying the distance between an imprint lithography template having a patterning surface thereon and the substrate to define a desired volume therebetween filled by the imprint fluid;

solidifying the imprint fluid to form a first patterned layer conforming to the patterning surface, the patterned layer having a residual layer;

separating the imprint lithography template from the formed first patterned layer;

measuring the thickness of the residual layer at a plurality of points;

mapping the thickness of the residual layer as a two dimensional function, $f(x,y)$ with an assigned thickness for each measured point;

calculating the average thickness, $g(x,y)$, of the residual layer;

calculating the deviation from the average as $w(x,y)=g(x,y)-f(x,y)$; and altering the first drop pattern by calculating offsets in the x and y direction based on $g(x,y)$ and adjusting local unit fluid volume, number of drps, position of drops and drop volume based on deviation $w(x,y)$ to provide a second drop pattern that provides for a substantially uniform residual layer.

20. The method of claim 19 further comprising forming a second patterned layer on a substrate using the second drop pattern.

* * * * *